United States Patent [19]

Meyerhoefer et al.

[11] Patent Number: 4,856,060
[45] Date of Patent: Aug. 8, 1989

[54] SOLID STATE TELEPHONE PROTECTOR MODULE

[75] Inventors: Carl Meyerhoefer, Dix Hills; Helmuth Neuwirth, Garden City, both of N.Y.

[73] Assignee: Porta Systems Corp., Syosset, N.Y.

[21] Appl. No.: 227,079

[22] Filed: Aug. 1, 1988

[51] Int. Cl.⁴ .............................................. H02H 3/22
[52] U.S. Cl. .................................... 379/412; 379/331; 361/119
[58] Field of Search ............... 379/437, 412, 331, 332; 361/119, 111, 124, 125, 58; 337/28, 29, 14, 15, 17, 20

[56] References Cited

U.S. PATENT DOCUMENTS 4,642,723 2/1987 Achtnig et al. ................. 361/119 X
4,758,921 7/1988 Hung .................................. 361/119

Primary Examiner—James L. Dwyer
Attorney, Agent, or Firm—Charles E. Temko

[57] ABSTRACT

A solid state protector module for individual subscriber circuits particularly suited for use with laminar type quick clip connector blocks. The module comprises a printed circuit board mounting integrated circuit protector units which are thermally sensitive. Solder preforms are resiliently urged against integrated circuit units by a shorting spring, mounting the solder preforms allowing the shorting spring to ground the individual circuit. The solder preforms including a camming circuit allowing the shorting spring to urge the preform perpendicularly to the normal direction of spring movement.

3 Claims, 2 Drawing Sheets

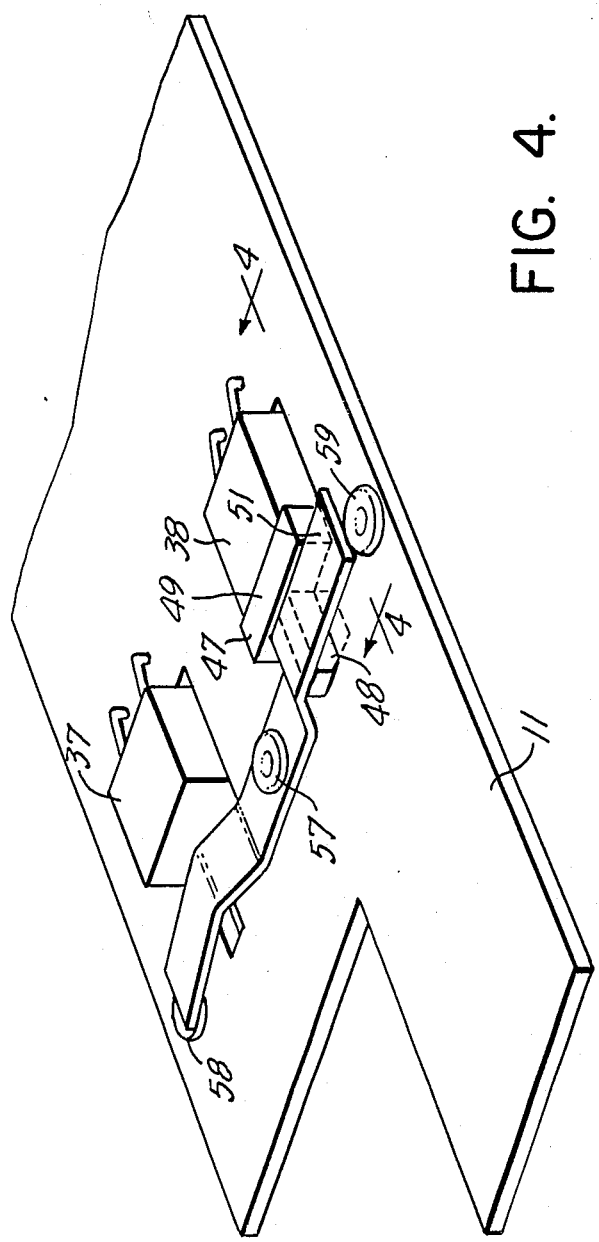
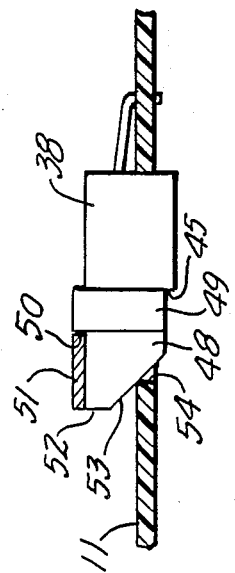

SOLID STATE TELEPHONE PROTECTOR MODULE

BACKGROUND OF THE INVENTION

This invention relates generally to the field of telephony, and more particularly to an improved subscriber circuit protector module of solid state type suitable for use with laminar type connector blocks employing quick clip terminals. Connector blocks of this type are disclosed in the copending application of Paul V. DeLuca, et al., Ser. No. 896,119 filed Aug. 13, 1986, now U.S. Pat. No. 4,813,071, and assigned to the same assignee as the instant application.

Since the individual laminae forming the blocks of this type are relatively thin, it follows that conventional five pin protector modules cannot be used for this purpose. Ideally, a suitable protector module is of reduced thickness in the order of less than one-quarter of an inch at the thickest point, while yet retaining all of the capability of a conventional module.

SUMMARY OF THE INVENTION

Briefly stated, the invention contemplates the provision of a fail short device for an improved solid state subscriber circuit protector module formed as a miniature printed circuit board. The board is provided with through openings within which integrated circuits are mounted. A ground spring is connected to the surface of the board at a medially located point, having extended legs on either side of the mounting point that rests upon a solder preform of generally button shaped configuration positioned in the same through opening as the integrated circuit component with an angularly disposed camming surface contacting an edge of the opening. Under pressure from the shorting spring, the solder preform is cammed against a surface of the integrated ciruit for effective heat transmission therebetween. This pressure is maintained during melting which occurs as the integrated circuit overheats during excess current transmission, and causes the shorting spring to eventually contact grounding eyelets connected to tip and ring connections on the circuit side of the printed circuit board thereby providing an integral failshort, shunting any high power cross currents to ground.

BRIEF DESCRIPTION OF THE DRAWINGS

In the drawings, to which reference will be made in the specification, similar reference characters have been employed to designate corresponding parts throughout the several views.

FIG. 3 is a fragmentary view in perspective thereof showing an upper surface.

FIG. 4 is a fragmentary sectional view thereof as seen from the plane 4—4 in FIG. 3.

DETAILED DESCRIPTION OF THE DISCLOSED EMBODIMENT

Figure 1:
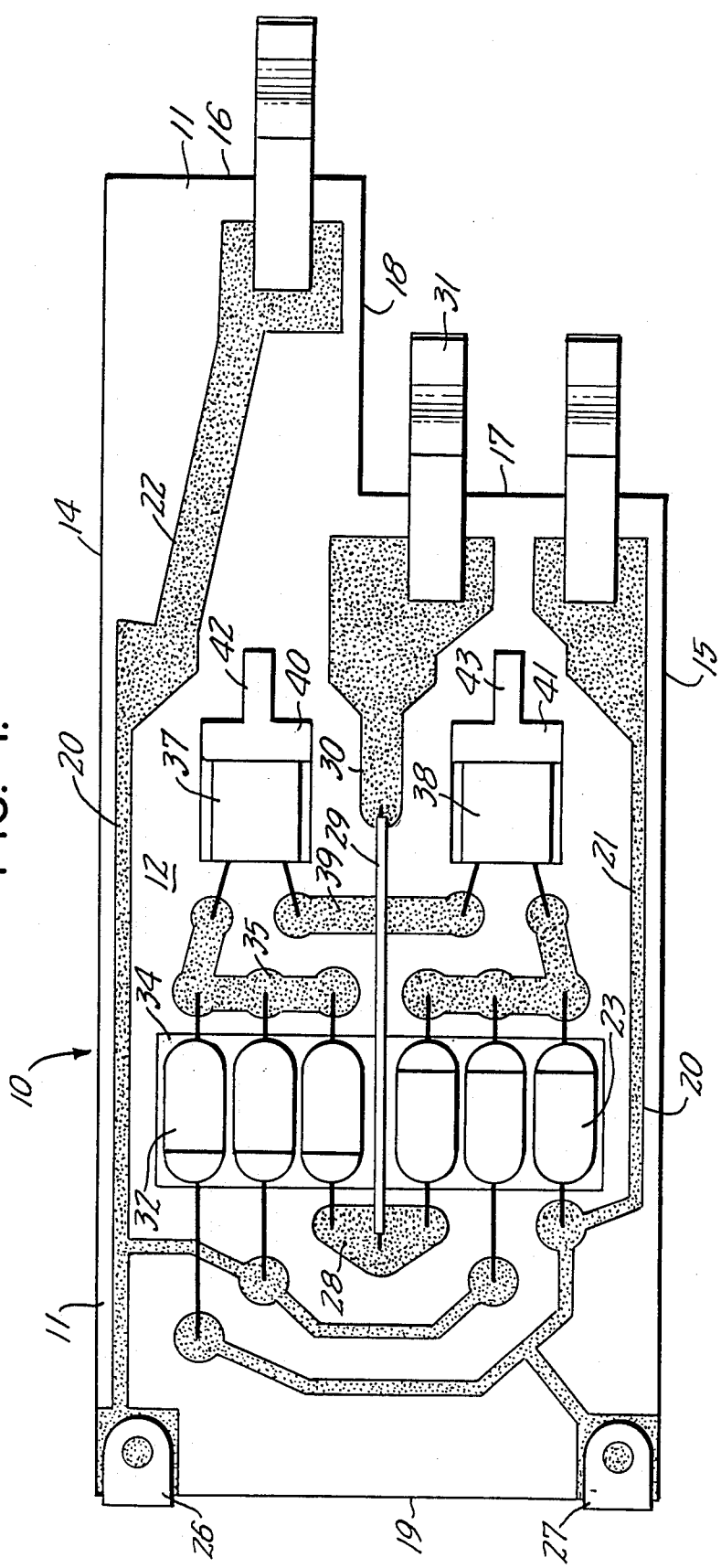
FIG. 1 is a bottom plan view of an embodiment of the invention.

In accordance with the invention, the device, generally indicated by reference character 10 includes a synthetic resinous base 11, having a first or upper surface 12, a second or lower surface 13, side edges 14 and 15, inner edges 16 and 17, a longitudinal edge 18 and an outer edge 19. A printed circuit 20 includes first and second long contacts 21 and 22, a known diode circuit 23, and branch conductors 24 and 25. Metallic clips 26 and 27 communicate with the contacts 21 and 22, and form test points for use by craftpersonnel. Ground conductor segments 28, 29 and 30 communicate with a ground clip 31. The diode circuit 23 includes a group of individual diodes 32 contained within a housing 33, the housing being positioned within a rectangular opening 34. Overload conductors 35 and 36 communicate with integrated circuit overload protectors 37 and 38 which are connected in series through a conductor 39. The elements 37 and 38 are positioned within openings 40 and 41, which are rectangular in configuration, and include an elongated extension at 42 and 43 communicating therewith.

Referring to FIGS. 3 and 4, positioned within the extensions 42 and 43 are T-shaped solder preforms 47, each including an axially disposed leg 48 and a transversely extending leg 49. The axially disposed leg 48 forms a shoulder 50 with the leg 49 and is positioned beneath a shorting spring 51. An end surface 52 includes an angularly disposed portion 53 which contacts an end edge 54 of the extensions 42 and 43 wherein under pressure from the spring a camming action is obtained which tends to urge the individual solder preform against a corresponding surface 45 of a member 37–38.

The shorting spring 50 is conveniently formed as a metallic stamping, and is secured by a grommet 57 to a ground conductor 30 at a medial point. Additional grommets 58 and 59 communicate with branch conductors 24 and 25 which, in turn, communicate with tip and ring contacts 21 and 22.

The operation of the device will be apparent from a consideration of FIG. 3 in the drawing. During normal operation, the shorting spring 51 will urge the solder preforms 47 against the members 37 and 38 which, in turn, will prevent contact of the ends of the spring 51 with the grommets 58 and 59. Upon the occurrence of excess current, the members 37 and 38 will generate heat sufficient to fuse the solder preforms, following which the ends of the spring 51 will move downwardly as seen in FIG. 3 to short the tip and ring circuits to ground.

Figure 2:
FIG. 2 is a side elevational view thereof as seen from the lower portion of FIG. 1.

Referring to FIG. 2, the device will be seen to present a very low profile, approximately one-quarter of an inch thick at the thickest point, thus, ideally suiting the device for use with the individual lamina of laminar type blocks disclosed in the above-identified application.

We wish it to be understood that we do not consider the invention to be limited to the precise details of structure shown and set forth in this specification, for obvious modifications will occur to those skilled in the art to which the invention pertains.

We claim:

1. An improved solid state protector module for use with laminar type connector blocks for protecting an individual subscriber circuit, said module comprising: a generally planar insulated base having a pair of through openings extending between first and second oppositely disposed surfaces thereof, a printed circuit on one of said first and second surfaces; tip, ring and ground contacts extending outwardly of said base at one end thereof and communicating with said printed circuit; a pair of solid state integrated protector elements positioned within said through openings and electrically communicating with said printed circuit, said units being heat responsive to current overloads; a shorting spring interconnected at a medial point to said base to conduct to said ground contact having end portions overlying contacts communicating with said tip and ring contacts; a pair of fusable solder preforms each having an angularly positioned camming surface thereon positioned beneath each end portion of said shorting spring and within a through opening wherein said camming surface contacts an edge of a respective opening and is urged against a surface of a protector circuit for the transmission of heat thereto; whereby upon the occurrence of an overload current within said protector circuits, heat generated by said protective circuit causes said solder preforms to fuse and allow said shorting spring to contact said contacts communicating with said tip and ring contacts to ground the protected subscriber circuit.

2. An improved module in accordance with claim 1, further characterized in said solder preforms being of generally T-shaped configuration, including a transversely extending leg and an axially extending leg forming a shoulder engaging an end portion of said shorting spring.

3. An improved module in accordance with claim 1, further characterized in said protector circuits being connected in series.

* * * * *